United States Patent [19]

Han et al.

[11] Patent Number: 5,488,005

[45] Date of Patent: Jan. 30, 1996

[54] PROCESS FOR MANUFACTURING AN OFFSET GATE STRUCTURE THIN FILM TRANSISTOR

[75] Inventors: Min-Ku Han; Byung-Hyuk Min, both of Seoul, Rep. of Korea

[73] Assignee: Samsung Electronics Co., Ltd., Suwon, Rep. of Korea

[21] Appl. No.: 435,324

[22] Filed: May 5, 1995

[30] Foreign Application Priority Data

May 6, 1994 [KR] Rep. of Korea ............... 9959/1994

[51] Int. Cl.[6] ........................... H01L 21/86
[52] U.S. Cl. ................ 437/41; 437/21; 437/44; 148/DIG. 150
[58] Field of Search .......... 437/41 TFT, 40 TFT, 437/21, 913, 44; 148/DIG. 1, DIG.150

[56] References Cited

U.S. PATENT DOCUMENTS

| | | | |
|---|---|---|---|
| 4,597,160 | 7/1986 | Ipri | 148/DIG. 1 |
| 5,116,771 | 5/1992 | Karulkar | 437/40 TFT |
| 5,294,555 | 3/1994 | Mano et al. | 437/41 TFT |

FOREIGN PATENT DOCUMENTS

| | | | |
|---|---|---|---|
| 61-252667 | 11/1986 | Japan | 437/44 |
| 64-07566 | 1/1989 | Japan | 437/44 |
| 2206132 | 8/1990 | Japan | 437/41 TFT |
| 0613405 | 1/1994 | Japan | 437/40 TFT |

Primary Examiner—Brian E. Hearn
Assistant Examiner—Michael Trinh
Attorney, Agent, or Firm—Cushman, Darby & Cushman

[57] ABSTRACT

A process for manufacturing an offset gate structure thin film transistor which includes the steps of forming a first semiconductor layer, e.g., an active layer made of amorphous silicon or polysilicon, on a major surface of a substrate, e.g., a glass substrate of an LCD, forming a buffer layer on the first semiconductor layer, etching away a first region of the buffer layer and etching a corresponding region of the first semiconductor layer to a predetermined depth, to thereby form a recess and an underlying thin channel region in the first semiconductor layer, the thin channel region having a thickness less than that of the remainder of the first semiconductor layer, forming a second semiconductor layer on the buffer layer and exposed portions of the first semiconductor layer defining the recess, forming a gate insulating layer on the second semiconductor layer, forming a conductive layer on the gate insulating layer, etching the second semiconductor layer, the gate insulating layer, and the conductive layer so as to form a gate electrode structure overlying the thin channel region of the first semiconductor layer and offset resistance regions of the first semiconductor layer disposed on opposite sides of the thin channel region, and, ion-implanting impurities into the first semiconductor layer through exposed portions of the buffer layer disposed on opposite sides of the gate electrode structure, to thereby form source and drain regions on opposite sides of the offset resistance regions of the first semiconductor layer.

20 Claims, 2 Drawing Sheets

PROCESS FOR MANUFACTURING AN OFFSET GATE STRUCTURE THIN FILM TRANSISTOR

BACKGROUND OF THE INVENTION

The present invention relates generally to a process for manufacturing a thin film transistor, and, more particularly, to a process for manufacturing an offset gate structure thin film transistor.

A thin film transistor (TFT) is typically employed as a load resistor of a memory cell in a static random access memory device (SRAM), as a switching device for supplying a voltage to a pixel in a liquid crystal display device (LCD), and as a driving device for driving the peripheral circuits in an LCD. When used as a switching device in an LCD, the channel of the TFT is connected between a data line to which a driving voltage is supplied, and a pixel electrode, which applies the driving voltage to the liquid crystal of the LCD, and the gate electrode of the TFT is connected to a scan line to which a scanning signal is applied.

Such a TFT switching device for an LCD is generally fabricated in silicon. Typically, such a TFT includes a polysilicon or amorphous silicon active layer formed or stacked on the surface of a transparent substrate, such as a glass or quartz substrate, of the LCD, and a gate electrode deposited on a central portion of a gate insulating layer formed on the upper surface of the active layer. During fabrication, the source and drain regions are formed in the active layer by means of a well-known ion-implanation process, using the gate electrode as a self-alignment mask, such as is disclosed in U.S. Pat. No. 4,597,160. However, such a technique has a drawback, in that the channel region of the device (i.e., the region of the active layer beneath the gate electrode) is adjacent to the source and drain regions, thus increasing the off current of the device. By "off current", is meant the leakage current which flows between the source and drain electrodes of the device due to the electric field formed between the drain (or source) electrode and the gate electrode when no voltage is applied to the gate electrode, i.e., the applied gate (scan) voltage signal is "low" or "off". The charge that is accumulated due to the leakage current flowing from the source electrode, which is coupled to the pixel electrode, to the drain electrode, through the channel region, is leaked to the data line which is coupled to the drain electrode, which obviously has a deleterious effect on the performance and reliability of the device.

In order to overcome the above-described drawback of the conventional TFT fabrication technique, there has been proposed a TFT having an offset gate structure, in which the channel region is separated from the source and drain regions by respective offset resistance regions formed in opposite side portions of the channel region. More particularly, with reference now to FIG. 1, such an offset gate structure TFT includes an active layer 2 formed on the surface of a transparent substrate (not shown), a gate insulating layer 4 formed on a central portion of the upper surface of the active layer 2, and a gate electrode 6 formed on the gate insulating film 4. During fabrication, a photomask (not shown) is formed on the resultant structure and then etched by a photolithographic process so that the resultant patterned photomask covers the gate structure (4,6) and opposite side portions 2a-1, 2a-2 of the channel region 2a of the active layer 2. Then, the source and drain regions 2b, 2c, respectively, of the TFT are formed by an ion-implantation process, using the patterned photomask as an ion-implantation mask. Subsequently, the patterned photomask is removed.

Because the side portions 2a-1, 2a-2 of the channel region 2 remain undoped, they serve as offset resistance regions between the channel region 2 and the source region 2b, and between the channel region 2 and the drain region 2c, respectively, to thereby reduce the off current of the device. However, although such an offset gate structure TFT overcomes the excessive off current problem of the conventional TFT technology, the manufacture thereof requires additional photolithographic steps (deposition, patterning, and removal of ion-implantation photomask) which increase the complexity and expense of the TFT manufacturing process.

Further, it is well-known in the art that the thinner the active layer is, the greater the on current and the less the off current, thereby enhancing the performance of the TFT. However, because the overlying gate structure of the TFT is extremely thin, if the active layer is formed to a thickness of less than about 1,000 angstroms, major reliability and performance problems due to over-etching during the metal contact etching process occur. Thus, the currently available TFT manufacturing technology is limited in this respect.

Based on the above and foregoing, it can be appreciated that there presently exists a need in the art for a process for manufacturing an offset gate structure TFT which overcomes the above-described drawbacks and shortcomings of the presently available TFT manufacturing technology. The present invention fulfills this need.

SUMMARY OF THE INVENTION

The present invention encompasses a process for manufacturing an offset gate structure thin film transistor which includes the steps of forming a first semiconductor layer, e.g., an active layer made of amorphous silicon or polysilicon, on a major surface of a substrate, e.g., a glass substrate of an LCD, forming a buffer layer on the first semiconductor layer, etching away a first region of the buffer layer and etching a corresponding region of the first semiconductor layer to a predetermined depth, to thereby form a recess and an underlying thin channel region in the first semiconductor layer, the thin channel region having a thickness less than that of the remainder of the first semiconductor layer, forming a second semiconductor layer on the buffer layer and exposed portions of the first semiconductor layer defining the recess, forming a gate insulating layer on the second semiconductor layer, forming a conductive layer on the gate insulating layer, etching the second semiconductor layer, the gate insulating layer, and the conductive layer so as to form a gate electrode structure overlying the thin channel region of the first semiconductor layer and offset resistance regions of the first semiconductor layer disposed on opposite sides of the thin channel region, and, ion-implanting impurities into the first semiconductor layer through exposed portions of the buffer layer disposed on opposite sides of the gate electrode structure, to thereby form source and drain regions on opposite sides of the offset resistance regions of the first semiconductor layer.

In an alternative embodiment, the present invention encompasses a process for manufacturing a thin film transistor which includes the steps of forming a first semiconductor layer comprised of a first semiconductor material on a major surface of a substrate, forming a buffer layer on the first semiconductor layer, etching away a first region of the buffer layer and etching a corresponding region of the first semiconductor layer to a predetermined depth, to thereby form a recess and an underlying thin channel region in the first semiconductor layer, the thin channel region having a thickness less than that of the remainder of the first semiconductor layer, forming a second semiconductor layer comprised of a second semiconductor material on the buffer layer and exposed portions of the first semiconductor layer defining the recess, forming a gate insulating layer on the second semiconductor layer, forming a conductive layer on the gate insulating layer, etching the second semiconductor layer, the gate insulating layer, and the conductive layer so as to form a gate electrode structure overlying the thin channel region of the first semiconductor layer, and, ion-implanting impurities into the first semiconductor layer through exposed portions of the buffer layer disposed on opposite sides of the gate electrode structure, to thereby form source and drain regions on opposite sides of the thin channel region of the first semiconductor layer.

Although not limiting to the present invention, the offset gate structure TFT of the preferred embodiment of the present invention has particular utility as a switching device of an LCD, which requires low off current, and the TFT of the alternative embodiment of the present invention has particular utility as a driving device for driving the peripheral circuits of an LCD, which requires high on current.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and, in which.

DETAILED DESCRIPTION OF THE INVENTION

Figure 1:
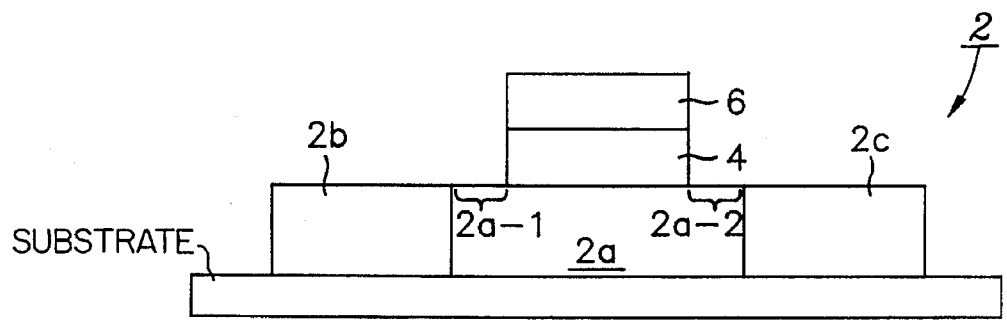
FIG. 1 is a diagrammatical cross-section of a previously proposed offset gate structure TFT.
Figure 2A:
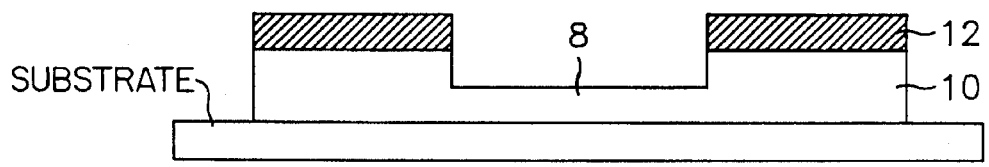
FIGS. 2A–2C are cross-sectional views depicting successive steps of a process for manufacturing an offset gate structure TFT in accordance with a preferred embodiment of the present invention; and, FIG. 3 is a graph depicting the gate voltage-drain current characteristics of a prior art offset gate structure TFT versus those of an offset gate structure TFT manufactured in accordance with the process of the present invention.
Figure 2B:
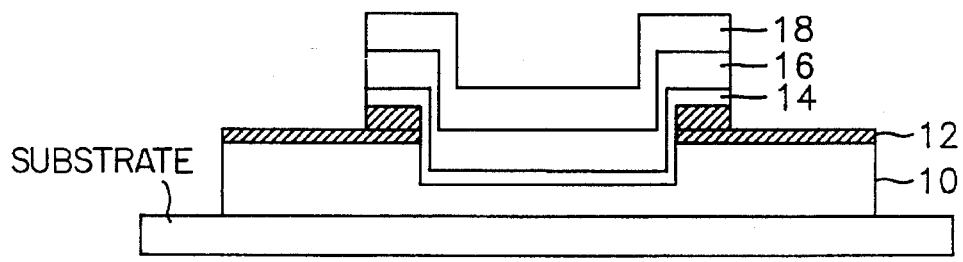
Figure 2C:
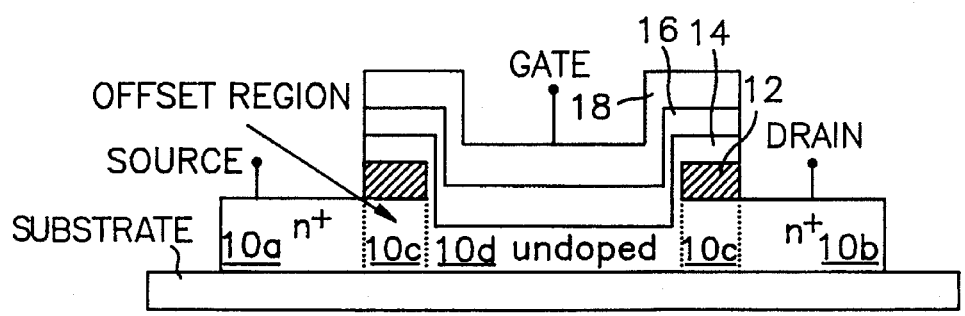

With reference now to FIGS. 2A–2C, the process for manufacturing an offset gate structure TFT in accordance with a preferred embodiment of the present invention will now be described.

With particular reference now to FIG. 2A, a first semiconductor layer or active layer 10 made of a first semiconductor material is formed on the surface of a transparent substrate (not shown), e.g., a glass substrate, preferably to a thickness of approximately 1,000 angstroms. The first semiconductor material is preferably comprised of amorphous silicon or polycrystalline silicon. Next, a buffer layer 12 is formed on the upper surface of the active layer 10, preferably to a thickness of approximately 500 angstroms, The buffer layer 12 may suitably be comprised of an insulating material, e.g., an oxide or nitride material. Then, a central region of the active layer 10 is etched to a predetermined depth, e.g., halfway (in the illustrative embodiment, approximately 500 angstroms), e.g., by a standard photlithographic etching process, to thereby form a thin channel region 8.

With particular reference now to FIG. 2B, a second semiconductor layer 14 is formed on the upper surface of the resultant structure depicted in FIG. 2A, preferably to a thickness of approximately 500 angstroms. The second semiconductor material is preferably comprised of amorphous silicon or polycrystalline silicon. Next, a gate insulating film 16 is formed on the upper surface of the second semiconductor layer 14, preferably to a thickness of approximately 1,000 angstroms. Then, a conductive or gate electrode layer 18 is formed on the surface of the gate insulating film 16. Thereafter, the layers 12, 14, 16, and 18 are etched, e.g., by means of a standard photolithographic etching process, to form a gate electrode structure (12, 14, 16, 18) overlying the channel region 8 and offset resistance regions 10c (designated "offset regions" in FIG. 2C) of the active layer 10 disposed on opposite sides of the channel region 8. Preferably, the exposed portion of the buffer layer 12 (i.e., the portions of the buffer layer not covered by the unetched/remaining portions of the layers 14, 16, and 18) is only partially etched, to thereby leave a thin portion of the buffer layer 12 on the portions of the upper surface of the active layer 10 uncovered by the gate electrode structure. Preferably, the thickness of the thin portion of the buffer layer 12 is approximately 100 angstroms.

With particular reference now to FIG. 2C, source and drain regions 10a and 10b, respectively, are formed in the active layer 10 adjacent opposite ones of the offset resistance regions 10c of the active layer 10, respectively, by means of an ion-implantation process, using the gate electrode structure (12, 14, 16, 18) as an ion-implantation mask. Of course, if p-type impurity ions are implanted into an n-type active layer 10, then the resultant TFT is a PMOS TFT, and if n-type impurity ions are implanted into a p-type active layer 10, then the resultant TFT is an NMOS TFT. After the ion-implantation step is completed, the thin portion of the buffer layer 12 can be removed.

Thus, the TFT produced by the above-described process of the present invention is an offset gate structure TFT comprised of a gate electrode structure (12, 14, 16, 18), an undoped central channel region 10d, undoped offset resistance regions 10c, disposed adjacent opposite sides, respectively, of undoped central channel region 10d, and doped source and drain regions 10a, 10b, disposed adjacent to respective ones of the offset resistance regions 10c. As will be readily appreciated, the thin central channel region 10d serves to increase the on current of the TFT, while the offset resistance regions ("offset regions") 10c serve to lower the off current of the TFT. Further, the thick portion of the buffer layer 12 disposed between the offset resistance regions 10c of the active layer 10 and overlapping, laterally outwardly extending flange portions of the layers 14, 16, and 18 of the gate electrode structure can be designed to prevent a voltage (e.g., scanning signal) applied to the gate electrode 18 from reaching the offset resistance regions 10c.

The above-described process for manufacturing an offset gate structure TFT in accordance with the present invention overcomes the drawbacks and shortcomings of the presently available offset gate structure TFT manufacturing technology. Namely, the process of the present invention eliminates the additional photolithographic steps (deposition, patterning, and removal of an ion-implantation photomask) required by the presently available technology for forming the offset resistance regions (10c) in the active layer (10), while also providing a thin (e.g., 500 angstroms thick) central channel region (10d) without any concern as to problems occasioned by over-etching during a subsequent metal contact etching process, due to the much greater thickness (e.g., 1,000 angstroms) of the remainder of the active layer 10.

In an alternative embodiment, the process of the present invention can be modified to eliminate the laterally outwardly extending flange portions of the gate electrode structure, i.e., to pattern the layers 14, 16, and 18 to only cover the thin, central channel region 10*d*, rather than to overlap the surface portions of the active layer 10 adjacent opposite sides of the thin, central channel region 10*d*, thereby eliminating the offset regions 10*c*. The resultant TFT would not have an offset gate structure, but would have a the recessed, thin, central channel region 10*d*, and, consequently, would have a higher on current than would the offset gate structure TFT of the above-described preferred embodiment of the present invention. Such a TFT would be particularly useful as a driving device for driving the peripheral circuits in an LCD, which requires high on current. The offset gate structure TFT, on the other hand, would be particularly useful as a switching device of a LCD, which requires low off current.

Figure 3:
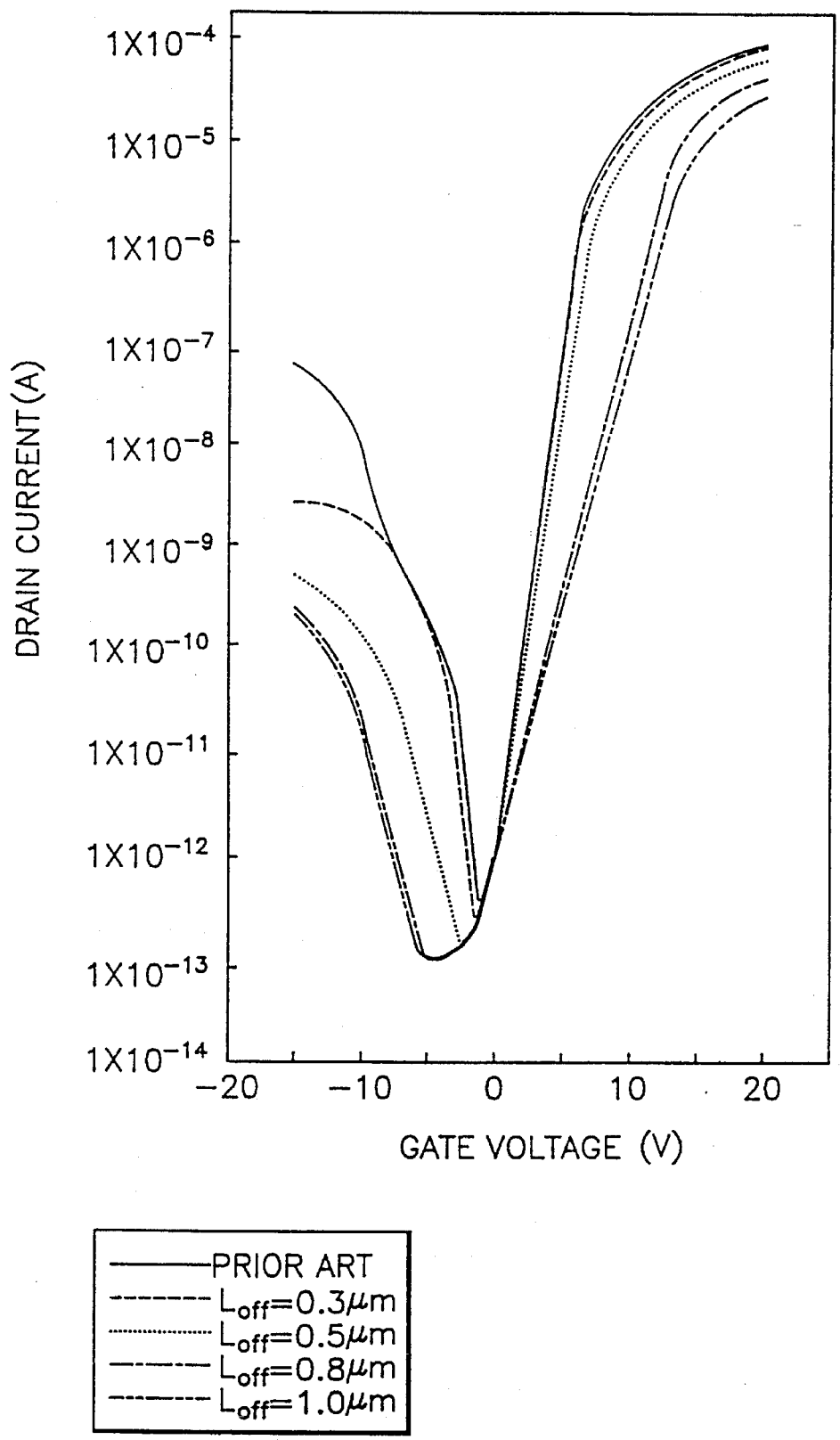

With reference now to FIG. 3, there can be seen a graph which depicts the gate voltage-drain current characteristics of a prior art offset gate structure TFT versus those of an offset gate structure TFT manufactured in accordance with the process of the present invention, based upon simulations performed by the inventors of the present invention. As can be discerned, the drain current (A) of the offset gate structure TFT of the present invention is lower than that of the prior art offset gate structure TFT, the on/off current ratio is increased. This on/off current ratio if at its maximum when the length ($L_{off}$) Of the offset regions 10*c* is 0.5 µm.

Although a preferred embodiment of the process of the present invention has been described in detail hereinabove, it should be clearly understood that many variations and/or modifications of the basic inventive concepts herein taught which may appear to those skilled in the art will still fall within the spirit and scope of the present invention as defined in the appended claims.

What is claimed is:

1. A process for manufacturing an offset gate structure thin film transistor, comprising the steps of:

forming a first semiconductor layer comprised of a first semiconductor material on a major surface of a substrate;

forming a buffer layer on said first semiconductor layer;

etching away a first region of said buffer layer and etching a corresponding region of said first semiconductor layer to a predetermined depth, to thereby form a recess and an underlying thin channel region in said first semiconductor layer, said thin channel region having a thickness less than that of the remainder of said first semiconductor layer;

forming a second semiconductor layer comprised of a second semiconductor material on said buffer layer and exposed portions of said said first semiconductor layer defining said recess;

forming a gate insulating layer on said second semiconductor layer;

forming a conductive layer on said gate insulating layer;

etching said second semiconductor layer, said gate insulating layer, and said conductive layer so as to form a gate electrode structure overlying said thin channel region of said first semiconductor layer and offset resistance regions of said first semiconductor layer disposed on opposite sides of said thin channel region; and, ion-implanting impurities into said first semiconductor layer through exposed portions of said buffer layer disposed on opposite sides of said gate electrode structure, to thereby form source and drain regions on opposite sides of said offset resistance regions of said first semiconductor layer.

2. The process as set forth in claim 1, wherein said gate electrode structure includes a central, recessed portion overlying said thin channel region of said first semiconductor layer, and laterally outwardly extending flange portions overlying corresponding portions of said buffer layer and said offset resistance regions of said first semiconductor layer.

3. The process as set forth in claim 2, further comprising the step of partially etching said buffer layer prior to the ion-implanting step, using said gate electrode structure as an etching mask, whereby said exposed portions of said buffer layer are made thinner than said corresponding portions of said buffer layer.

4. The process as set forth in claim 1, wherein said first and second semiconductor materials are selected from the group consisting of polycrystalline silicon and amorphous silicon.

5. The process as set forth in claim 3, wherein said first and second semiconductor materials are selected from the group consisting of polycrystalline silicon and amorphous silicon.

6. The process as set forth in claim 4, wherein said buffer layer is made of an insulating material.

7. The process as set forth in claim 1, further comprising the step of removing said exposed portions of said buffer layer.

8. The process as set forth in claim 3, further comprising the step of removing said exposed portions of said buffer layer.

9. The process as set forth in claim 1, wherein said thickness of said remainder of said first semiconductor layer is X angstroms, and said predetermined depth is ½ X angstroms, so that said thickness of said thin channel region of said first semiconductor layer is ½ X angstroms.

10. The process as set forth in claim 9, wherein X=1,000.

11. The process as set forth in claim 3, wherein said exposed portions of said buffer layer have a thickness of approximately 100 angstroms.

12. The process as set forth in claim 1, wherein said substrate is a transparent substrate of an LCD.

13. A process for manufacturing a thin film transistor, comprising the steps of:

forming a first semiconductor layer comprised of a first semiconductor material on a major surface of a substrate;

forming a buffer layer on said first semiconductor layer;

etching away a first region of said buffer layer and etching a corresponding region of said first semiconductor layer to a predetermined depth, to thereby form a recess and an underlying thin channel region in said first semiconductor layer, said thin channel region having a thickness less than that of the remainder of said first semiconductor layer;

forming a second semiconductor layer comprised of a second semiconductor material on said buffer layer and exposed portions of said first semiconductor layer defining said recess;

forming a gate insulating layer on said second semiconductor layer;

forming a conductive layer on said gate insulating layer;

etching said second semiconductor layer, said gate insulating layer, and said conductive layer so as to form a gate electrode structure overlying said thin channel region of said first semiconductor layer; and, ion-implanting impurities into said first semiconductor layer through exposed portions of said buffer layer disposed on opposite sides of said gate electrode structure, to thereby form source and drain regions on opposite sides of said thin channel region of said first semiconductor layer.

14. The process as set forth in claim 13, further comprising the step of partially etching said buffer layer prior to the ion-implanting step, using said gate electrode structure as an etching mask, whereby said exposed portions of said buffer layer are made thinner.

15. The process as set forth in claim 13, wherein said first and second semiconductor materials are selected from the group consisting of polycrystalline silicon and amorphous silicon.

16. The process as set forth in claim 13, wherein said buffer layer is made of an insulating material.

17. The process as set forth in claim 15, wherein said buffer layer is made of an insulating material.

18. The process as set forth in claim 13, further comprising the step of removing said exposed portions of said buffer layer.

19. The process as set forth in claim 14, further comprising the step of removing said exposed portions of said buffer layer.

20. The process as set forth in claim 13, wherein said substrate comprises a transparent substrate of an LCD.

\* \* \* \* \*